(12) United States Patent
Lindley et al.

(10) Patent No.: US 10,763,150 B2
(45) Date of Patent: Sep. 1, 2020

(54) SYSTEM FOR COUPLING A VOLTAGE TO SPATIALLY SEGMENTED PORTIONS OF THE WAFER WITH VARIABLE VOLTAGE

(71) Applicant: Applied Materials, Inc., Santa Clara, CA (US)

(72) Inventors: Roger Alan Lindley, Santa Clara, CA (US); Philip Allan Kraus, San Jose, CA (US); Thai Cheng Chua, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 172 days.

(21) Appl. No.: 15/710,773

(22) Filed: Sep. 20, 2017

(65) Prior Publication Data

US 2019/0088522 A1 Mar. 21, 2019

(51) Int. Cl.
*H01L 21/683* (2006.01)
*H01L 21/67* (2006.01)
(Continued)

(52) U.S. Cl.
CPC .... *H01L 21/6833* (2013.01); *H01J 37/32009* (2013.01); *H01J 37/32532* (2013.01); *H01J 37/32715* (2013.01); *H01L 21/31116* (2013.01); *H01L 21/67069* (2013.01); *H01L 21/67109* (2013.01); *H01L 21/6875* (2013.01); *H01L 21/68742* (2013.01); *H01J 2237/334* (2013.01)

(58) Field of Classification Search
CPC .......... H01J 37/32009; H01J 37/32532; H01J 37/32715; H01L 21/6833; H01L 21/31116; H01L 21/67069; H01L 21/67109; H01L 21/68742; H01L 21/6875

See application file for complete search history.

(56) References Cited

U.S. PATENT DOCUMENTS 5,099,697 A 3/1992 Agar
5,770,023 A 6/1998 Sellers
(Continued)

OTHER PUBLICATIONS

U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
(Continued)

*Primary Examiner* — Kelly M Gambetta
(74) *Attorney, Agent, or Firm* — Patterson + Sheridan, LLP

(57) ABSTRACT

The present disclosure generally relates to plasma assisted or plasma enhanced processing chambers. More specifically, embodiments herein relate to electrostatic chucking (ESC) substrate supports configured to provide independent pulses of direct-current ("DC") voltage through a switching system to electrodes disposed in the ESC substrate support. In some embodiments, the switching system can independently alter the frequency and duty cycle of the pulsed DC voltage that is coupled to each electrode. In some embodiments, during processing of the substrate, the process rate, such as etch rate or deposition rate, can be controlled independently in regions of the substrate because the process rate is a function of the frequency and duty cycle of the pulsed DC voltage. The processing uniformity of the process performed on the substrate is improved.

20 Claims, 7 Drawing Sheets

(51) Int. Cl.
*H01L 21/311* (2006.01)
*H01J 37/32* (2006.01)
*H01L 21/687* (2006.01)

(56) References Cited

U.S. PATENT DOCUMENTS

| | | | |
|---|---|---|---|
| 6,051,114 | A | 4/2000 | Yao et al. |
| 6,099,697 | A * | 8/2000 | Hausmann .......... H01L 21/6831 |
| | | | 204/192.12 |
| 6,187,685 | B1 | 2/2001 | Hopkins et al. |
| 6,201,208 | B1 | 3/2001 | Wendt et al. |
| 6,253,704 | B1 | 7/2001 | Savas |
| 7,126,808 | B2 | 10/2006 | Koo et al. |
| 7,718,538 | B2 | 5/2010 | Kim et al. |
| 7,888,240 | B2 | 2/2011 | Hamamjy et al. |
| 8,382,999 | B2 | 2/2013 | Agarwal et al. |
| 8,383,001 | B2 | 2/2013 | Mochiki et al. |
| 8,603,293 | B2 | 12/2013 | Koshiishi et al. |
| 8,828,883 | B2 | 9/2014 | Rueger |
| 8,916,056 | B2 | 12/2014 | Koo et al. |
| 8,926,850 | B2 | 1/2015 | Singh et al. |
| 9,101,038 | B2 | 8/2015 | Singh et al. |
| 9,105,452 | B2 | 8/2015 | Jeon et al. |
| 9,150,960 | B2 | 10/2015 | Nauman et al. |
| 9,490,107 | B2 | 11/2016 | Kim et al. |
| 9,583,357 | B1 | 2/2017 | Long et al. |
| 9,601,319 | B1 | 3/2017 | Bravo et al. |
| 9,620,376 | B2 | 4/2017 | Kamp et al. |
| 9,761,459 | B2 | 9/2017 | Long et al. |
| 9,852,889 | B1 | 12/2017 | Kellogg et al. |
| 9,881,820 | B2 | 1/2018 | Wong et al. |
| 2006/0158823 | A1 | 7/2006 | Mizuno et al. |
| 2007/0285869 | A1 * | 12/2007 | Howald .............. H01L 21/6831 |
| | | | 361/234 |
| 2008/0135401 | A1 | 6/2008 | Kadlec et al. |
| 2008/0289576 | A1 | 11/2008 | Lee et al. |
| 2010/0018648 | A1 * | 1/2010 | Collins ............. H01J 37/32082 |
| | | | 156/345.24 |
| 2010/0072172 | A1 | 3/2010 | Ui et al. |
| 2011/0281438 | A1 | 11/2011 | Lee et al. |
| 2012/0000421 | A1 | 1/2012 | Miller et al. |
| 2012/0088371 | A1 | 4/2012 | Ranjan et al. |
| 2014/0154819 | A1 | 6/2014 | Gaff et al. |
| 2014/0262755 | A1 | 9/2014 | Deshmukh et al. |
| 2014/0263182 | A1 | 9/2014 | Chen et al. |
| 2016/0056017 | A1 | 2/2016 | Kim et al. |
| 2017/0011887 | A1 | 1/2017 | Deshmukh et al. |
| 2017/0018411 | A1 | 1/2017 | Sriraman et al. |
| 2017/0069462 | A1 | 3/2017 | Kanarik et al. |
| 2017/0110335 | A1 | 4/2017 | Yang et al. |
| 2017/0113355 | A1 | 4/2017 | Genetti et al. |
| 2017/0115657 | A1 | 4/2017 | Trussell et al. |
| 2017/0117172 | A1 | 4/2017 | Genetti et al. |
| 2017/0169996 | A1 * | 6/2017 | Ui ..................... H01J 37/32091 |
| 2017/0178917 | A1 | 6/2017 | Kamp et al. |
| 2017/0236688 | A1 | 8/2017 | Caron et al. |
| 2017/0236741 | A1 | 8/2017 | Angelov et al. |
| 2017/0236743 | A1 | 8/2017 | Severson et al. |
| 2017/0250056 | A1 | 8/2017 | Boswell et al. |
| 2017/0263478 | A1 | 9/2017 | McChesney et al. |
| 2017/0316935 | A1 | 11/2017 | Tan et al. |
| 2017/0330786 | A1 | 11/2017 | Genetti et al. |
| 2017/0334074 | A1 | 11/2017 | Genetti et al. |
| 2017/0372912 | A1 | 12/2017 | Long et al. |
| 2018/0366305 | A1 * | 12/2018 | Nagami ............. H01J 37/32385 |

OTHER PUBLICATIONS

U.S. Appl. No. 15/424,405; entitled System for Tunable Workpiece Biasing in a Plasma Reactor; by Travis Koh, et al.; filed Feb. 3, 2017; 29 total pages.

U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.

PCT Notification of Transmittal of the International Search Report and the Written Opinion of the International Searching Authority for International Application No. PCT/US2018/046182; dated Nov. 30, 2018; 10 total pages.

Wang, S.B., et al.—"Control of ion energy distribution at substrates during plasma processing," Journal of Applied Physics, vol. 88, No. 2, Jul. 15, 2000, pp. 643-646.

* cited by examiner

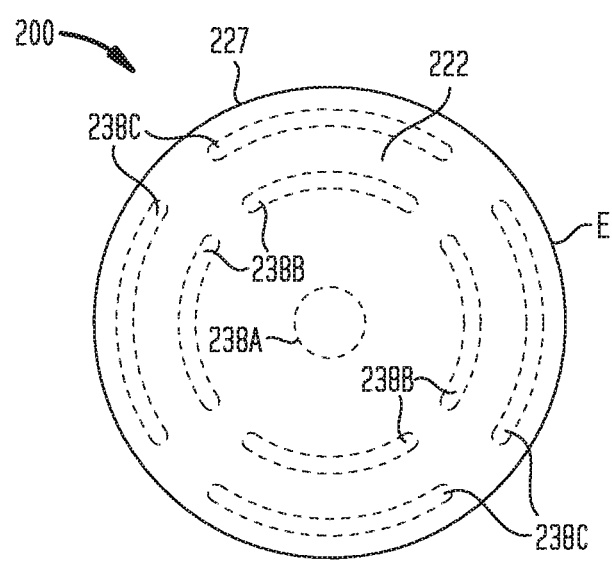

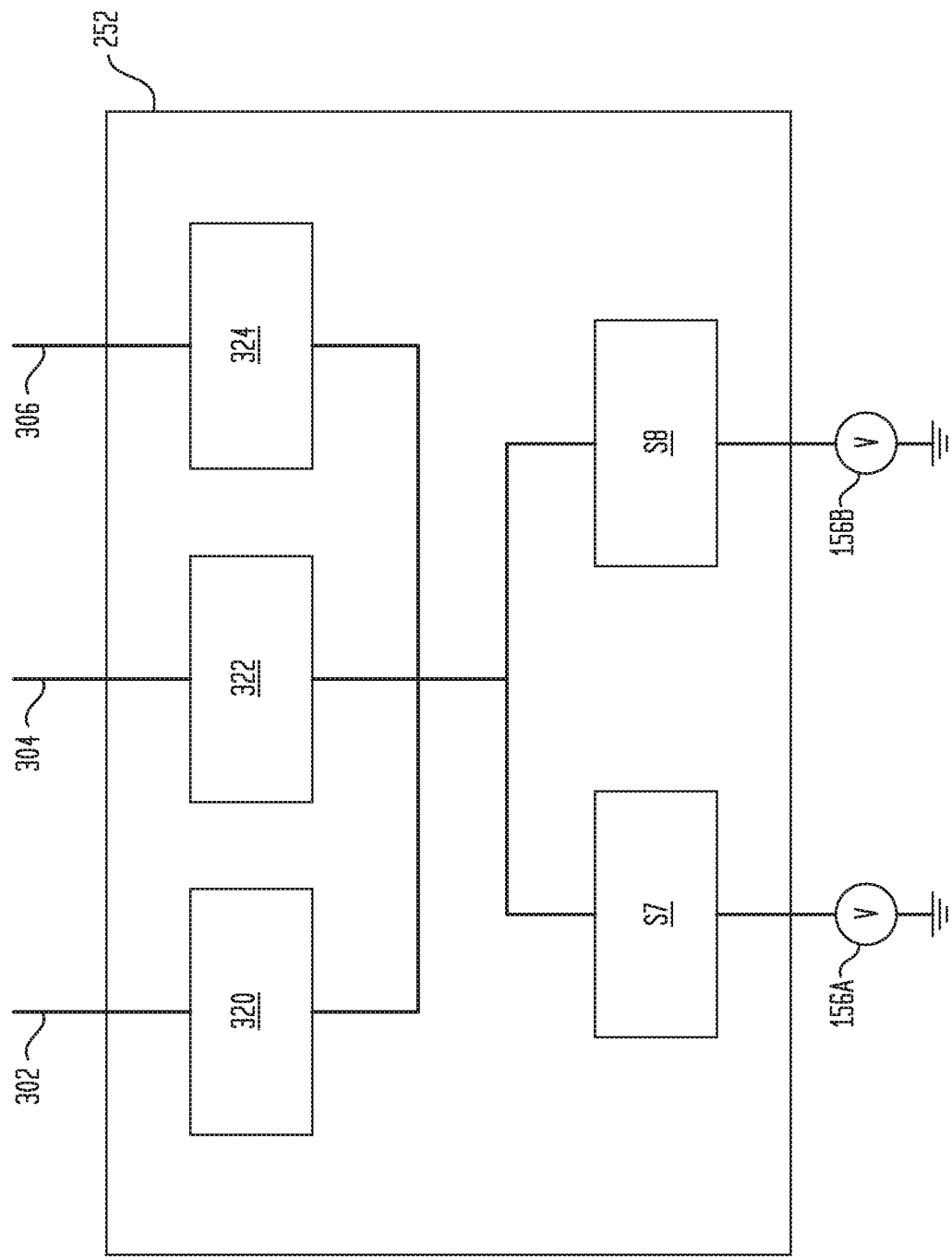

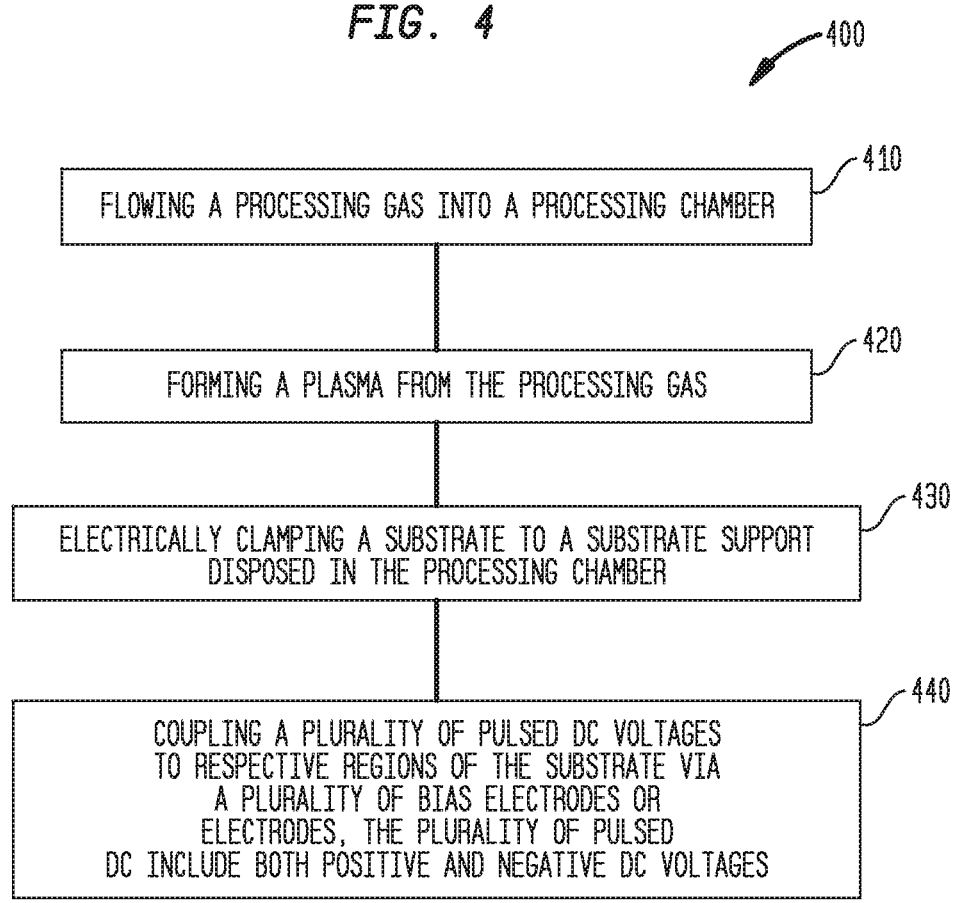

SYSTEM FOR COUPLING A VOLTAGE TO SPATIALLY SEGMENTED PORTIONS OF THE WAFER WITH VARIABLE VOLTAGE

BACKGROUND

Field

Embodiments described herein generally relate to processing chambers used in semiconductor manufacturing, in particular, to processing chambers having a substrate support assembly configured to bias a substrate disposed thereon, and methods of processing the substrate.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process to form high aspect ratio openings in a material layer, such as a dielectric layer, of a substrate. In a typical plasma assisted etching process, a plasma is formed in the processing chamber and ions from the plasma are accelerated towards the substrate, and openings formed in a mask thereon, to form openings in a material layer beneath the mask surface.

Typically, the ions are accelerated towards the substrate by coupling a low frequency RF power in the range of 400 kHz to 2 MHz to the substrate thereby creating a bias voltage thereon. However, coupling an RF power to the substrate does not apply a single voltage to the substrate relative to the plasma. In commonly used configurations, the potential difference between the substrate and the plasma oscillates from a near zero value to a maximum negative value at the frequency of the RF power. The lack of a single potential, accelerating ions from the plasma to the substrate, results in a large range of ion energies at the substrate surface and in the openings (features) being formed in the material layers thereof. In addition, the disparate ion trajectories that result from RF biasing produce large angular distributions of the ions relative to the substrate surface. Large ranges of ion energies are undesirable when etching the openings of high aspect ratio features as the ions do not reach the bottom of the features with sufficiently high energies to maintain desirable etch rates. Large angular distributions of ions relative to the substrate surface are undesirable as they lead to deformations of the feature profiles, such as necking and bowing in the vertical sidewalls thereof.

Accordingly, there is a need in the art for the ability to provide narrow ranges of high energy ions with low angular distributions at the material surface of a substrate during a plasma assisted etching process.

SUMMARY

The present disclosure generally relates to plasma assisted or plasma enhanced processing chambers. In one embodiment, a substrate support assembly includes a substrate support, a plurality of electrodes extending through the substrate support, a pair of switches, wherein each electrode of the plurality of electrodes is electrically connected to the pair of switches, at least one trim voltage source electrically connected between the pair of switches and at least one of the plurality of electrodes, and a chucking electrode planarly embedded in the substrate support.

In another embodiment, a substrate support assembly includes a substrate support, a plurality of bias electrodes embedded in the substrate support, a pair of switches, wherein each bias electrode of the plurality of electrodes is electrically connected to the pair of switches, at least one trim voltage source electrically connected between the pair of switches and at least one of the plurality of electrodes, and a chucking electrode planarly embedded in the substrate support.

In another embodiment, a processing chamber includes a chamber lid, one or more sidewalls, a chamber bottom, wherein the chamber lid, the one or more sidewalls, and the chamber bottom define a processing volume, and a substrate support assembly disposed in the processing volume, the substrate support assembly including a cooling base, a substrate support coupled to the cooling base, a chucking electrode planarly embedded in the substrate support, a plurality of bias electrodes embedded in the substrate support, a pair of switches, wherein at least one bias electrode of the plurality of bias electrodes is electrically connected to the pair of switches, and at least one trim voltage source electrically connected between the pair of switches and at least one of the bias electrodes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2B is a plan view of the substrate support assembly shown in FIG. 2A, according to one embodiment.

FIGS. 3A-3C are schematic views of a switching system according to embodiments described herein.

FIG. 4 is a flow diagram illustrating a method of biasing regions of a substrate during plasma assisted processing, according to embodiments described herein.

Figure 1A:
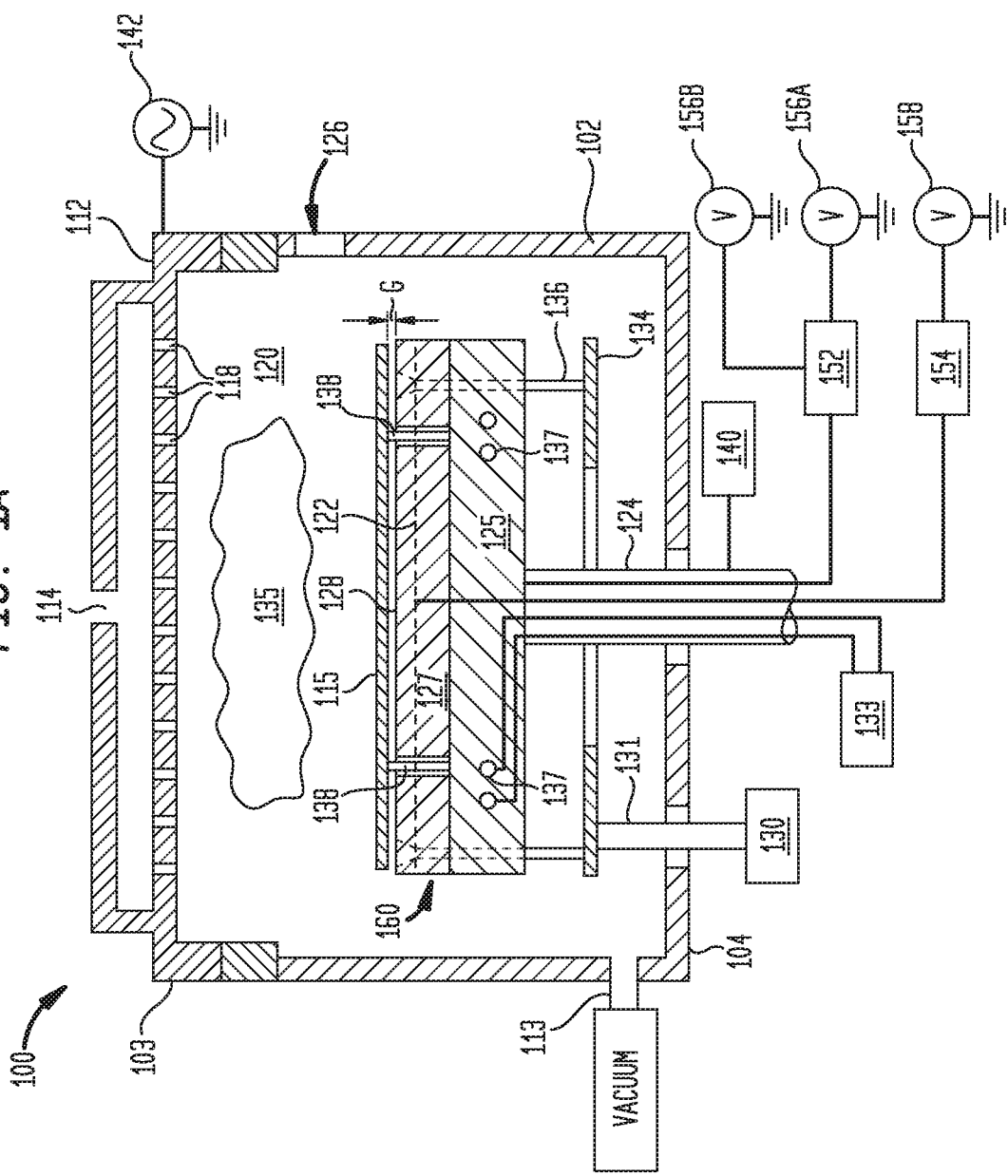
FIG. 1A is a schematic sectional view of a processing chamber including a substrate support with a plurality of electrodes disposed therein, according to one embodiment.

To facilitate understanding, identical reference numerals have been used, where possible, to designate identical elements that are common to the figures. It is contemplated that elements and features of one implementation may be beneficially incorporated in other implementation without further recitation.

DETAILED DESCRIPTION

The present disclosure generally relates to plasma assisted or plasma enhanced processing chambers. More specifically, embodiments herein relate to electrostatic chucking (ESC) substrate supports configured to provide independent pulses of direct-current ("DC") voltage through a switching system to electrodes disposed in the ESC substrate support, for example pins disposed through the substrate support, or to electrodes disposed on a surface of the substrate support, or to electrodes embedded in the substrate support. In some embodiments, the switching system can independently alter the frequency and duty cycle of the pulsed DC voltage that is coupled to each electrode. In some embodiments, a pulsed DC voltage that is coupled to an electrode is independently adjusted by one of a plurality of trim voltage sources coupled to the electrode. In some embodiments, during processing of the substrate, the process rate, such as etch rate or deposition rate, can be controlled independently in regions of the substrate because the process rate is a function of the frequency, the duty cycle, and the voltage magnitude of the pulsed DC voltage. The processing uniformity of the process performed on the substrate is improved.

FIG. 1A is a schematic sectional view of a processing chamber 100 having an electrostatic chucking (ESC) substrate support assembly 160 disposed therein, according to one embodiment. In this embodiment, the processing chamber 100 is a plasma processing chamber, such as a plasma etch chamber, a plasma-enhanced deposition chamber, for example a plasma-enhanced chemical vapor deposition (PECVD) chamber, a plasma treatment chamber, or a plasma-enhanced atomic layer deposition (PEALD) chamber, or a plasma based ion implant chamber, for example a plasma doping (PLAD) chamber.

The processing chamber 100 includes a chamber lid 103, one or more sidewalls 102, and a chamber bottom 104 which define a processing volume 120. The chamber lid 103 includes a showerhead 112 having a plurality of openings 118 disposed therethrough. The showerhead 112 is used to uniformly distribute processing gases from a gas inlet 114 formed in the chamber lid 103 into the processing volume 120. The showerhead 112 is coupled to an RF power supply 142, or in some embodiments a VHF power supply, which forms a plasma 135 from the processing gases through capacitive coupling therewith. The processing volume 120 is fluidly coupled to a vacuum, such as to one or more dedicated vacuum pumps, through a vacuum outlet 113 which maintains the processing volume 120 at sub-atmospheric conditions and evacuates processing and other gases therefrom. A substrate support assembly 160 is disposed in the processing volume 120 and is configured to support a substrate 115 during processing. The substrate support assembly 160 includes a substrate support 127, a cooling base 125 coupled to the substrate support 127, and a plurality of electrodes 138 extending through the substrate support 127. The substrate support assembly 160 is disposed on a support shaft 124 sealingly extending through the chamber bottom 104. The support shaft 124 is coupled to a controller 140 that raises and lowers the support shaft 124, and the substrate support assembly 160 disposed thereon, to facilitate processing of the substrate 115 and transfer of the substrate 115 into and out of the processing chamber 100. Typically, when the substrate support assembly 160 is in a raised or processing position, the substrate 115 is spaced apart from the showerhead 112 between about 0.2 inches and 2 inches, such as about 1.25 inches.

The substrate 115 is loaded into the processing volume 120 through an opening 126 in one of the one or more sidewalls 102, which is conventionally sealed with a door or a valve (not shown) during the processing of the substrate 115. A plurality of lift pins 136 disposed above a lift pin hoop 134 are movably disposed through the substrate support assembly 160 to facilitate transferring of the substrate 115 thereto and therefrom. The lift pin hoop 134 is coupled to a lift hoop shaft 131 sealingly extending through the chamber bottom 104, which raises and lowers the lift pin hoop 134 by means of an actuator 130. When the lift pin hoop 134 is in a raised position, the plurality of lift pins 136 extend above the surface of the substrate support 127 lifting the substrate 115 therefrom and enabling access to the substrate 115 by a robot handler (not shown). When the lift pin hoop 134 is in a lowered position, the plurality of lift pins 136 are flush with, or below the surface of the substrate support 127, and the substrate 115 rests on the electrodes 138 extending through the substrate support 127.

The cooling base 125 of the substrate support assembly 160 is used to regulate the temperature of the substrate support 127, and thereby the substrate 115 disposed thereon, during processing. The cooling base 125 may include one or more fluid conduits 137 formed therein that are fluidly coupled to, and in fluid communication with, a coolant source 133, such as a refrigerant source or water source. The cooling base 125 is formed of a corrosion resistant electrically and thermally conductive material, such as a corrosion resistant metal, for example aluminum, an aluminum alloy, or stainless steel. The substrate support 127 is typically formed from a dielectric material, such as a ceramic material, for example $Al_2O_3$, AlN, $Y_2O_3$, or combinations thereof. The substrate support 127 herein is thermally and fixedly coupled to the cooling base 125 with an adhesive or by suitable mechanical means.

The substrate support assembly 160 provides for electrical biasing of the substrate 115 and clamping of the substrate 115 thereto. The substrate 115 is biased through direct electrical contact with the plurality of electrodes 138. The plurality of electrodes 138, which is substantially conductive, may be fixed or movably coupled to the substrate support 127 or the cooling base 125. In one embodiment, each electrode 138 is spring mounted. In one embodiment, the electrodes 138 are conductive pins. The plurality of electrodes 138 are formed of a corrosion resistant electrically conductive material, such as aluminum, an aluminum alloy, silicon carbide, or combinations thereof. The plurality of electrodes 138 is collectively connected to a first power supply 156A and a second power supply 156B through a switching system 152. As shown in FIG. 1A, the electrodes 138 are in electrical contact with the cooling base 125, and the electrically conductive cooling base 125 is electrically connected to the switching system 152. In one embodiment, the first power supply 156A is a positive DC voltage source and the second power supply 156B is a negative DC voltage source. In one embodiment, the electrodes 138 are collectively connected to the first power supply 156A and the second power supply 156B through the switching system 152, as shown in FIG. 1A. In another embodiment, each electrode 138 is independently connected to the first power supply 156A and the second power supply 156B through the switching system 152.

The switching system 152 includes two switches, such as solid state pulsers/switchers or fast high voltage transistor switches, capable of converting a high voltage (HV) DC power to a cyclic DC voltage having a frequency between about 10 Hz and about 1 MHz. For example, the switches may have a switching frequency of up to 1 MHz. Such switches may be operable to interrupt and re-establish electrical connection at a frequency up to 1 MHz. In other cases, the switches may be operable to vary the bias of the electrodes 138 between a first value that is a target bias value and a second non-zero value with an absolute value below a threshold value, for example about 5% of the target value, at a frequency up to about 1 MHz. In one embodiment, the switches are fast high-voltage transistor switches, and the cyclic DC voltage has a frequency of about 1 MHz. In another embodiment, the switches are fast high-voltage transistor switches, and the cyclic DC voltage has a frequency of about 100 kHz. In another embodiment, the switches are fast high-voltage transistor switches, and the cyclic DC voltage has a frequency of about 10 kHz. In another embodiment, the switches are fast high-voltage transistor switches, and the cyclic DC voltage has a frequency of about 1 kHz. The switching system 152 further includes a trim voltage source for providing an additional electric potential to the electrodes 138 that can be tuned to achieve a desired electric potential at the electrodes 138, while the switches provides connection to either the first or second voltage source 156A/B. Because the process rate, such as etch rate or deposition rate, is a function of the frequency, the duty cycle, and the voltage magnitude of the pulsed DC voltage, the process rate can be finely controlled. The switching system 152 is described in more detail in connection with FIG. 3A.

During processing, the substrate 115 rests on, and makes direct contact with, the plurality of electrodes 138 which extend above the dielectric material of the substrate support 128 a distance G. The distance G is between about 1 µm and about 10 µm, such as between about 3 µm and about 7 µm, for example about 5 µm. The substrate 115, spaced apart from the substrate support surface 128 by the distance G, is securely held to the plurality of electrodes 138 by a clamping force from a chucking electrode 122. The chucking electrode 122 includes one or more continuous electrically conductive materials, such as a mesh, foil, or plate planarly disposed and embedded in the dielectric material of the substrate support 127. The chucking electrode 122 is electrically isolated from the plurality of electrodes 138 by openings formed in the chucking electrode 122. The chucking electrode 122 is electrically coupled to a chucking controller 154 that is electrically coupled to a third power supply 158, for example a static DC power supply. In some embodiments, the chucking electrode 122 includes one or more discontinuous conductive materials, such as meshes, foils, plates, or combinations thereof, that are electrically coupled with one or more connectors so that the discontinuous materials form a single electrode.

Figure 1B:
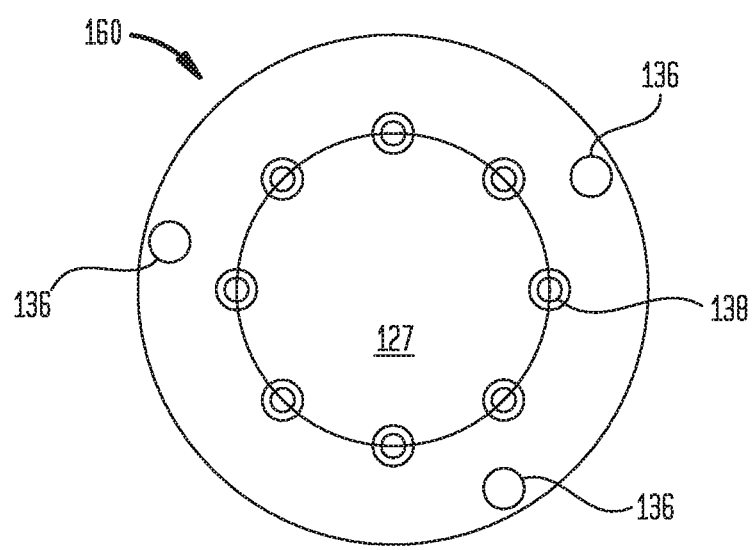
FIG. 1B is a plan view of a portion of the substrate support assembly shown in FIG. 1A, according to one embodiment.

FIG. 1B is a plan view of a portion of the substrate support assembly 160 shown in FIG. 1A, according to one embodiment. As shown in FIG. 1B, the substrate support assembly 160 includes the substrate support 127. The plurality of lift pins 136 can extend through the substrate support 127. In one embodiment, there are three lift pins 136. The plurality of electrodes 138 extend through the substrate support 127, and the plurality of electrodes 138 may be arranged to couple pulsed DC voltage to spatially segmented portions, or regions, of the substrate 115. In one embodiment, the plurality of electrodes 138 is arranged in a circular pattern, as shown in FIG. 1B. In one embodiment, the plurality of electrodes 138 may be arranged in two or more concentric circles.

Figure 2A:
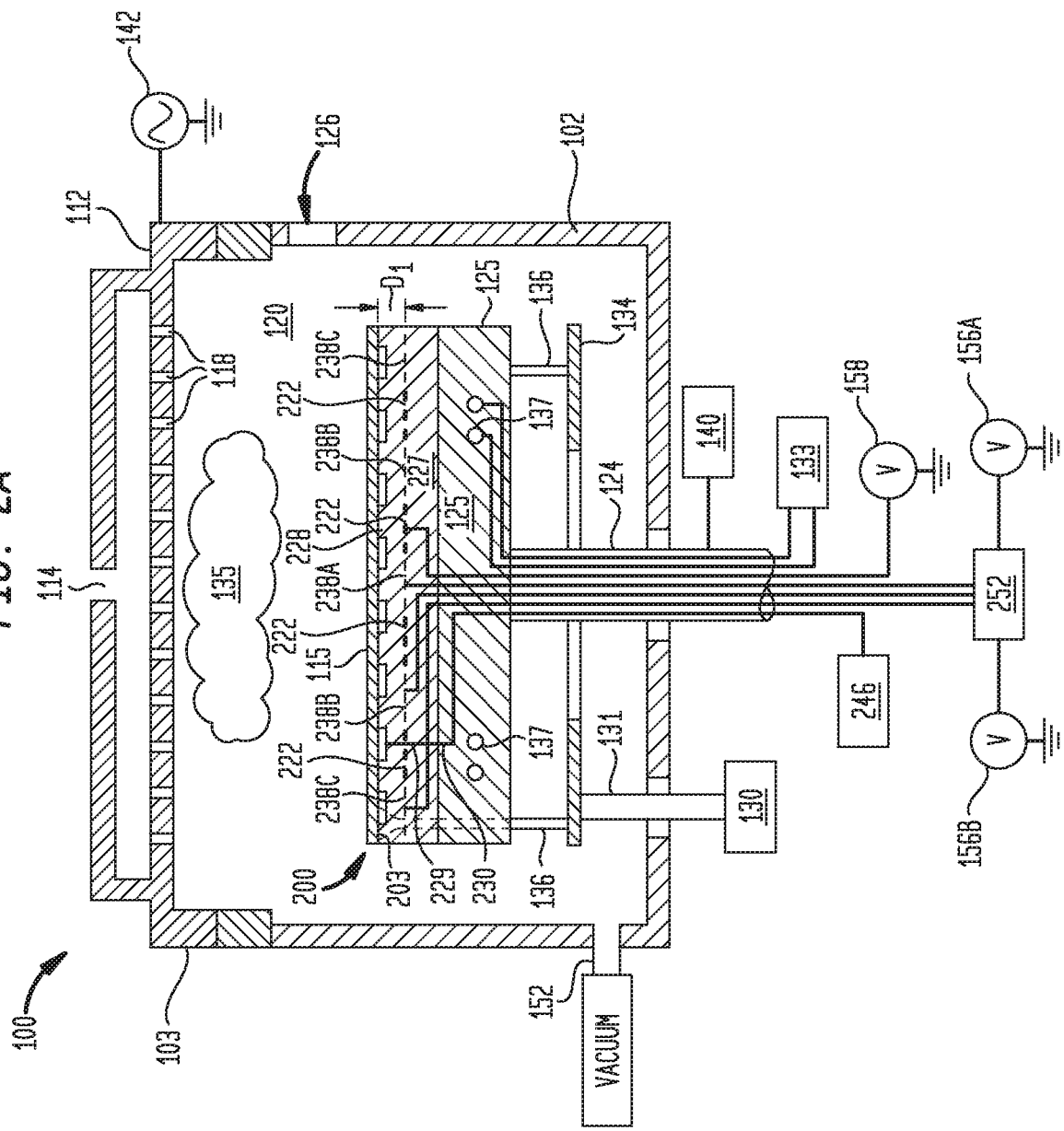
FIG. 2A is a schematic sectional view of a processing chamber including a substrate support with a plurality of electrodes embedded therein, according to one embodiment.

FIG. 2A is a schematic sectional view of the processing chamber 100 with an ESC substrate support assembly 200 disposed therein, according to one embodiment. The processing chamber 100 shown in FIG. 2A is similar to the processing chamber 100 shown in FIG. 1A, except the ESC substrate support assembly 160 is replaced with a different ESC substrate support assembly 200. The substrate support assembly 200 includes a substrate support 227 and the cooling base 125 thermally coupled to the substrate support 227. The substrate support 227 includes a substrate support surface 203 configured to support the substrate 115 during processing. The cooling base 125 of the substrate support assembly 200 is used to regulate the temperature of the substrate support 227, and in some cases the substrate 115 disposed on the substrate support surface 203, during processing. The cooling base 125 is thermally coupled to the substrate support 227 with an adhesive or by mechanical means.

As shown in FIG. 2A, a backside gas is provided between the substrate 115 and the substrate support surface 203 of the substrate support assembly 200 during processing, where the backside gas thermally couples the substrate 115 to the substrate support surface 203 and increases the heat transfer therebetween. The substrate support surface 203 includes a plurality of protrusions 228 extending therefrom. The plurality of protrusions 228 enables the backside gas to flow between the substrate 115 and the substrate support surface 203. The backside gas flows to the substrate support surface 203 through one or more gas conduits 229 formed in the substrate support 227. The one or more gas conduits 229 are coupled to an inert backside gas source 246, such as a He gas source, via one or more gas conduits 230 formed in the cooling base 125. In one embodiment, a dielectric coating is formed over the substrate support surface 203. The dielectric coating is fabricated from a dielectric material, such as $Al_2O_3$, AlN, $Y_2O_3$, or combinations thereof.

A plurality of bias electrodes 238A-C and a unitary chucking electrode 222 are embedded in the substrate support 227. The bias electrodes 238A-C are electrically isolated from each other and from the chucking electrode 222. Each of the plurality of bias electrodes 238A-C is configured to provide one or more independent pulsed DC voltage to respective regions of the substrate 115 through capacitive coupling. The chucking electrode 222 provides a clamping force between the substrate 115 and the substrate support surface 203 by providing a potential therebetween. The chucking electrode 222 is connected to the third power supply 158. The distance D1 between the bias electrodes 238A-C and the substrate support surface 203 ranges from about 5 µm to about 300 µm, such as from about 100 µm to about 300 µm, for example about 160 µm.

In one embodiment, a plurality of conductive features is disposed on the substrate support surface 203. Each conductive feature is disposed between adjacent protrusions 228. Each conductive feature is electrically connected to a corresponding bias electrode 238A-C. In one embodiment, the dielectric coating is formed over the plurality of conductive features.

In some embodiments, the substrate support 227 is configured to support a substrate 115, such as a 300 mm diameter substrate. The substrate support 227 includes between 2 and 20 bias electrodes, such as the three bias electrodes 238A-C shown. However, larger substrate supports for processing larger substrates and/or substrates of different shapes may include a different number of bias electrodes. Each of the plurality of bias electrodes 238A-C is formed of one or more electrically conductive material parts, such as a metal mesh, foil, plate, or combinations thereof. In some embodiments, each of the plurality of bias electrodes 238A-C is formed of more than one discontinuous electrically conductive material parts, such as a plurality of metal meshes, foils, plates, or combinations thereof, that are electrically coupled with one or more connectors (not shown) disposed in the substrate support 227 so that the electrically coupled discontinuous material parts comprise a single electrode, such as the center bias electrode 238A, the intermediate bias electrode 238B, or the outer bias electrode 238C.

Typically, the plurality of bias electrodes 238A-C is spatially arranged across the substrate support 227 in a pattern that is advantageous for managing uniformity of processing results across the substrate 115. In one embodiment, the electrode 238A is a circular plate and the bias electrodes 238B-C are discontinuous annuluses, which define a plurality of concentric zones. In other embodiments, other spatial arrangements include spoke patterns, grid patterns, line patterns, spiral patterns, interdigitated patterns, random patterns, or combinations thereof. In one embodiment, the plurality of bias electrodes 238A-C is planarly disposed with each other and with the chucking electrode 222. Each of the plurality of bias electrodes 238A-C is electrically isolated from the chucking electrode 222 by openings formed in the chucking electrode 222 and by the dielectric material of the substrate support 227 disposed therebetween. In other embodiments, the plurality of bias electrodes 238A-C, and/or portions thereof, are coplanar with each other and are closer to the substrate support surface 203 than the chucking electrode 222.

Each of the plurality of bias electrodes 238A-C is independently electrically connected to the first power supply 156A and the second power supply 156B through a switching system 252. Each of the plurality of bias electrodes 238A-C can provide an independently controlled pulsed DC voltage to a region of the substrate 115 adjacent to, or in contact with, the bias electrode 238A-C. The switching system 252 is described in detail in FIGS. 3B-3C.

FIG. 2B is a plan view of a portion of the substrate support assembly 200 shown in FIG. 2A. As shown in FIG. 2B, the substrate support assembly 200 includes the substrate support 227. The plurality of bias electrodes 238A-C and the chucking electrode 222 are embedded in the substrate support 227. As shown in FIG. 2B, the bias electrode 238A is a circular plate, the bias electrode 238B are three discontinuous electrode pieces defining a first annulus, and the bias electrode 238C are three discontinuous electrode pieces defining a second annulus. The first and second annuluses defined by the bias electrodes 238B, 238C are concentric with the circular plate of the bias electrode 238A. In one embodiment, each electrode piece of the bias electrodes 238B, 238C is independently connected to the first power supply 156A and the second power supply 156B through the switching system 252. In another embodiment, the electrode pieces of the bias electrode 238B, 238C are electrically connected to each other and to the first power supply 156A and the second power supply 156B through the switching system 252. The chucking electrode 222 is electrically isolated from the plurality of bias electrodes 238A-C. The arrangement, or pattern, of the plurality of bias electrodes 238A-C provides pulsed DC voltage to respective regions of the substrate 115 that the process rate, such as etch rate or deposition rate, performed thereon can be independently controlled.

Figure 3A:
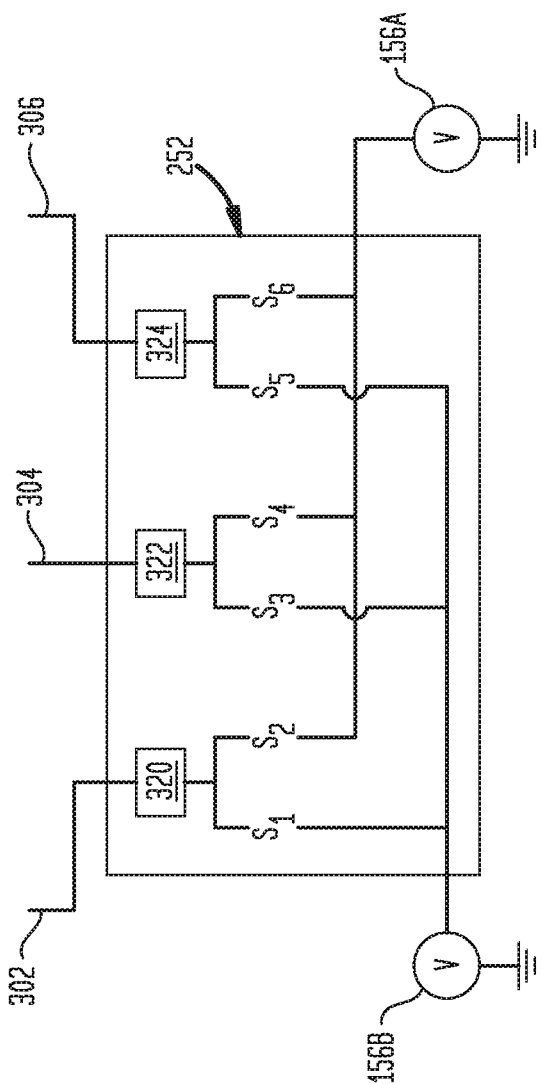

FIG. 3A is a schematic view of the switching system 152 according to one embodiment. As shown in FIG. 3A, the switching system 152 includes a pair of switches S9, S10 and a trim voltage source 301. Each switch S9, S10 may be a solid state pulser/switch, a high-voltage transistor switch, or any suitable switch. The fast high voltage transistor switch may have a switching time, for example a turn-off/turn-on time in the case of a switch that interrupts the circuit, a circuit change time in the case of a switch that switches from a first circuit to a second circuit, or a state 1 to state 2 time in the case of a switch that changes only the bias of the electrodes 138, of about 1 microsecond, or longer times, which enables fast switching of pulsed DC voltages to regions of the substrate 115. The trim voltage source 301 may be a small voltage source, such as a voltage source capable of produce a voltage of up to positive or negative 500 V. The first and second power suppliers 156A, 156B are large voltage sources capable of produce voltages up to positive or negative 5000 V. The trim voltage source 301 is connected to the cooling base 125 by an electrical connection 303. The trim voltage source 301 is electrically connected between the pair of switches S9, S10 and the plurality of electrodes 138. The trim voltage source 301 can be utilized to tune the voltages applied to regions of the substrate 115 through the plurality of electrodes 138.

Figure 3B:
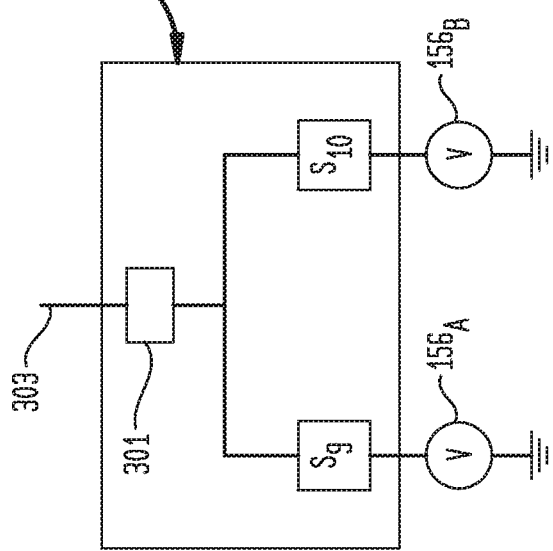

FIG. 3B is a schematic view of the switching system 252 according to one embodiment. As shown in FIG. 3B, the switching system 252 includes a plurality of switches S1, S2, S3, S4, S5, S6 and a plurality of trim voltage sources 320, 322, 324. Each switch S1, S2, S3, S4, S5, S6 may be a solid state pulser/switch, a high-voltage transistor switch, or any suitable switch. The fast high voltage transistor switch may have a switching time, for example a turn-off/turn-on time in the case of a switch that interrupts the circuit, a circuit change time in the case of a switch that switches from a first circuit to a second circuit, or a state 1 to state 2 time in the case of a switch that changes only the bias of the bias electrodes 238A-C, of about 1 microsecond, or longer times, which enables fast switching of pulsed DC voltages to regions of the substrate 115. The trim voltage sources 320, 322, 324 may be a small voltage source, such as a voltage source capable of produce a voltage of up to positive or negative 500 V. The switches S1, S2, S3, S4, S5, S6 form a plurality of pairs of switches, and each pair of switches S1/S2, S3/S4, S5/S6 is connected to a corresponding bias electrode 238A-C shown in FIG. 2A via an electrical connection 302, 304, or 306. Each voltage source of the plurality of voltage sources 320, 322, 324 is electrically connected between each pair of switches and the corresponding bias electrode 238A-C. One switch of the pair of switches is connected to the first power supply 156A, and the other switch of the pair of switches is connected to the second power supply 156B. For example, switches S2, S4, S6 are connected to the first power supply 156A, and switches S1, S3, S5 are connected to the second power supply 156B. The switches S1, S2, S3, S4, S5, and S6 are connected to the reference voltage of one of the voltage sources 320, 322, 324, such that each voltage source 320, 322, 324 provides a small voltage bias, positive or negative, relative to the output potential of the switches. In this way, the voltage sources 320, 322, and 324 can provide different electric potentials to different bias electrodes 238A-C.

Each bias electrode 238A-C shown in FIG. 2A is connected to both the first and second power supplies 156A, 156B, and depending on the position of the switches S1-S6, different pulsed DC voltage can be applied to the bias electrodes 238A-C to control the process rate, for example etch rate or deposition rate, across the substrate 115 during processing. Furthermore, each bias electrode 238A-C shown in FIG. 2A is connected to one of the voltage sources 320, 322, or 324, to provide local tuning of the voltage applied thereto. In other words, each bias electrode 238A-C shown in FIG. 2A is connected to a pair of switches and one voltage source of the plurality of voltage sources 320, 322, 324, one switch of the pair of switches is connected to the first power supply 156A, and the other switch of the pair of switches is connected to the second power supply 156B. Each voltage source 320, 322, 324 connected to each bias electrode 238A-C provides an additional voltage to the voltage supplied by the first and second power supplies 156A, 156B. The individual voltage source 320, 322, 324 provides for making incremental voltage adjustments in each region of the substrate 115 to control processing rate and uniformity.

Although three pairs of switches and three voltage sources are shown in FIG. 3B, more or less pairs of switches and voltage sources may be utilized. In one embodiment, eight pairs of switches, or sixteen switches, and eight voltage sources, are utilized in the switching system 252. In one embodiment, the first power supply 156A is a positive DC voltage source and the second power supply 156B is a negative DC voltage source. Thus, the power supplied to the bias electrodes 238A-C can be bipolar. The switches S2, S4, S6 connected to the positive power supply 156A control the timing of the positive bias pulses, and the switches S1, S3, S5 connected to the negative power supply 156B control the timing of the negative bias pulses. The timing of the positive and negative bias pulses may be coordinated. For example, a coordinated voltage sequence includes a negative voltage pulse followed by a positive voltage pulse, or vice versa. The magnitudes of the positive and negative pulses are independently set by the power supplies 156A, 156B and the plurality of voltage sources 320, 322, 324. The durations of the positive voltage pulses and the negative voltage pulses are independently controllable by the switches S1, S2, S3, S4, S5, S6. The overall duration of the cycle is managed by the coordinated switching of the switches S1, S2, S3, S4, S5, S6 for each bias electrode 238A-C.

In one embodiment, each power supply 156A, 156B has one power setting. In another embodiment, each power supply 156A, 156B has multiple power settings. With the switching system 252 connecting both the positive power supply 156A and the negative power supply 156B to each bias electrode 238A-C, independent bipolar pulses can be applied to each bias electrode 238A-C. The bipolar pulses can have independent settings among bias electrodes 238A-C, and the durations of the positive and negative pulses to each bias electrode 238A-C can be independently controlled.

FIG. 3C is a schematic view of the switching system 252 according to another embodiment. The switching system 252 includes two switches S7, S8 and the plurality of voltage sources 320, 322, 324. The switches S7, S8 may be the same switches as the switches S1-S6. The switch S7 is connected to the first power supply 156A, and the switch S8 is connected to the second power supply 156B. The voltage sources 320, 322, 324 are connected to the switches S7, S8. In one embodiment, the switch S7 may be on and the switch S8 may be off so the pulsed DC voltage from the first power supply 156A is applied to the electrical connections 302, 304, 306. The voltage sources 320, 322, 324 provide additional voltages to the pulsed DC voltage from the first power supply 156A to the electrical connections 302, 304, 306, respectively. In another embodiment, the switch S8 may be on and the switch S7 may be off so the pulsed DC voltage from the second power supply 156B is applied to the electrical connections 302, 304, 306. The voltage sources 320, 322, 324 provide incremental voltages to the pulsed DC voltage from the second power supply 156B to the electrical connections 302, 304, 306, respectively. The overall duration of the cycle is managed by the coordinated switching of the switches S7, S8 and the incremental voltage supplied by each voltage source 320, 322, 324 for each bias electrode 238A-C.

FIG. 4 is a flow diagram illustrating a method 400 of biasing a substrate during plasma assisted processing, according to embodiments described herein. The method 400 includes block 410 with flowing a processing gas into a processing chamber. The processing chamber may be the processing chamber 100. At block 420, a plasma is formed in the processing chamber from the processing gas. At block 430, a substrate is electrically clamped to a substrate support, such as substrate support 127 described in FIG. 1A or substrate support 227 described in FIG. 2A, disposed in the processing chamber, such as the processing chamber 100. The clamping force is provided by an ESC electrode embedded in dielectric material of the substrate support and coupled to an ESC power.

The method 400 at block 440 includes coupling a plurality of pulsed DC voltages to respective regions of the substrate via a plurality of electrodes. The plurality of electrodes may be the plurality of bias electrodes 238A-C described in FIG. 2A or the electrodes 138 of FIG. 1A. The plurality of pulsed DC voltages may include both positive and negative DC voltages. Each respective pulsed DC voltage provides an individual pulsed DC voltage to a region of the substrate through capacitive coupling or direct contact with the electrodes. The plurality of pulsed DC voltages is varied by a plurality of voltage sources, such as the plurality of voltage sources 320, 322, 324 described in FIG. 3A. In some embodiments, the plurality of pulsed DC voltages includes more than one polarity and/or more than one frequency. The plurality of pulsed DC voltages is applied to the electrodes via a switching system including a plurality of switches and a plurality of voltage sources. The switching system may be the switching system 152 described in FIG. 3A or the switch system 252 described in FIGS. 3B and 3C. The plasma may be formed after block 420, 430, or 440.

The substrate support assembly and method described herein enable pulsed DC biasing of individual substrate regions, through capacitive coupling or direct electrical contact, during plasma assisted processing that is compatible with use of an electrostatic clamping force. Pulsed DC biasing allows for increased control of ion energy and angular distribution at the substrate surface and/or regions thereof and in feature openings formed therein. This increased control is desirable at least in forming high aspect ratio features and/or features requiring a straight etch profile, such as high aspect ratio etching in dielectric materials for memory devices, including non-volatile flash memory devices and dynamic random access memory devices, and in silicon etch for shallow trench isolation (STI) applications or for silicon fins used in FinFET devices. The ability to apply varying potentials to different regions of the substrate enables tuning of across-substrate processing uniformity and improvement thereof.

While the foregoing is directed to embodiments of the present disclosure, other and further embodiments of the disclosure may be devised without departing from the basic scope thereof, and the scope thereof is determined by the claims that follow.

The invention claimed is:

1. A substrate support assembly, comprising:
   a substrate support having a substrate support surface;
   a plurality of electrodes extending through the substrate support and extending above the substrate support surface;
   a pair of switches, wherein each electrode of the plurality of electrodes is electrically connected to the pair of switches;
   at least one trim voltage source electrically and physically connected between the pair of switches and at least one of the plurality of electrodes; and
   a chucking electrode planarly embedded in the substrate support.

2. The substrate support assembly of claim 1, wherein the plurality of electrodes is a plurality of conductive pins.

3. The substrate support assembly of claim 1, wherein an electrode of the plurality of electrodes comprises aluminum, an aluminum alloy, silicon carbide, or combinations thereof.

4. The substrate support assembly of claim 1, wherein each switch of the pair of switches is a fast high-voltage transistor switch.

5. The substrate support assembly of claim 1, wherein at least a portion of the plurality of electrodes is arranged in a circular pattern.

6. The substrate support assembly of claim 1, further comprising a first voltage source connected to one switch of the pair of switches and a second voltage source connected to the other switch of the pair of switches.

7. The substrate support assembly of claim 6, wherein the first voltage source and the second voltage source have opposite polarity.

8. A substrate support assembly, comprising:
a substrate support;
a plurality of bias electrodes embedded in the substrate support;
a pair of switches, wherein each bias electrode of the plurality of bias electrodes is electrically connected to the pair of switches;
at least one trim voltage source electrically and physically connected between the pair of switches and at least one of the bias electrodes of the plurality bias of electrodes; and
a chucking electrode planarly embedded in the substrate support.

9. The substrate support assembly of claim 8, wherein each switch of the pair of switches is a fast high-voltage transistor switch.

10. The substrate support assembly of claim 8, wherein the plurality of bias electrodes comprises two to 20 bias electrodes.

11. The substrate support assembly of claim 8, wherein the plurality of bias electrodes comprises a circular plate and one or more discontinuous annuluses that are concentric with the circular plate.

12. The substrate support assembly of claim 8, wherein the plurality of bias electrodes is arranged in a spoke pattern, grid pattern, line pattern, spiral pattern, interdigitated pattern, random pattern, or combinations thereof.

13. The substrate support assembly of claim 8, wherein each bias electrode is isolated from every other bias electrode.

14. The substrate support assembly of claim 8, further comprising a first voltage source connected to one switch of the pair of switches and a second voltage source connected to the other switch of the pair of switches.

15. The substrate support assembly of claim 14, wherein the first voltage source and the second voltage source have opposite polarity.

16. A processing chamber, comprising:
a chamber lid;
one or more sidewalls;
a chamber bottom, wherein the chamber lid, the one or more sidewalls, and the chamber bottom define a processing volume; and
a substrate support assembly disposed in the processing volume, the substrate support assembly comprising;
a cooling base;
a substrate support coupled to the cooling base;
a chucking electrode planarly embedded in the substrate support;
a plurality of bias electrodes embedded in the substrate support;
a pair of switches, wherein at least one bias electrode of the plurality of bias electrodes is electrically connected to the pair of switches; and
at least one trim voltage source electrically and physically connected between the pair of switches and at least one of the bias electrodes.

17. The processing chamber of claim 16, wherein the plurality of bias electrodes is arranged in a spoke pattern, grid pattern, line pattern, spiral pattern, interdigitated pattern, random pattern, or combinations thereof.

18. The processing chamber of claim 16, wherein each bias electrode is isolated from every other bias electrode.

19. The processing chamber of claim 16, further comprising a first voltage source connected to one switch of the pair of switches and a second voltage source connected to the other switch of the pair of switches.

20. The processing chamber of claim 19, wherein the first voltage source and the second voltage source have opposite polarity.

* * * * *

UNITED STATES PATENT AND TRADEMARK OFFICE
CERTIFICATE OF CORRECTION

PATENT NO. : 10,763,150 B2
APPLICATION NO. : 15/710773
DATED : September 1, 2020
INVENTOR(S) : Roger Alan Lindley, Philip Allan Kraus and Thai Cheng Chua Page 1 of 1

It is certified that error appears in the above-identified patent and that said Letters Patent is hereby corrected as shown below:

In the Claims

Column 11, Line 28, In Claim 8, Delete "plurality bias of electrodes;" and insert -- plurality of bias electrodes; --, therefor.

Signed and Sealed this
Fifth Day of July, 2022

Katherine Kelly Vidal
*Director of the United States Patent and Trademark Office*